US011071209B2

(12) United States Patent
Hayahi

(10) Patent No.: US 11,071,209 B2
(45) Date of Patent: Jul. 20, 2021

(54) FITTING STRUCTURE FOR CONDUCTIVE SHEET AND ELECTRONIC DEVICE

(71) Applicant: NEC Platforms, Ltd., Kawasaki (JP)

(72) Inventor: Manabu Hayahi, Kawasaki (JP)

(73) Assignee: NEC Platforms, Ltd., Kanagawa (JP)

( * ) Notice: Subject to any disclaimer, the term of this patent is extended or adjusted under 35 U.S.C. 154(b) by 562 days.

(21) Appl. No.: 16/071,345

(22) PCT Filed: Dec. 14, 2016

(86) PCT No.: PCT/JP2016/087193
§ 371 (c)(1),
(2) Date: Jul. 19, 2018

(87) PCT Pub. No.: WO2017/138246
PCT Pub. Date: Aug. 17, 2017

(65) Prior Publication Data

US 2021/0168940 A1 Jun. 3, 2021

(30) Foreign Application Priority Data

Feb. 9, 2016 (JP) ............................ JP2016-022673

(51) Int. Cl.
*H05K 1/18* (2006.01)
*H05K 3/34* (2006.01)
(Continued)

(52) U.S. Cl.
CPC ............ *H05K 3/0058* (2013.01); *H05K 3/02* (2013.01); *H05K 5/0043* (2013.01)

(58) Field of Classification Search
CPC ...... H05K 1/0271; H05K 1/0274; H05K 1/18; H05K 1/182; H05K 1/183; H05K 3/34;
(Continued)

(56) References Cited

U.S. PATENT DOCUMENTS 6,065,980 A 5/2000 Leung et al.
6,633,241 B2 * 10/2003 Kaikuranta ............ H03K 17/98 341/20

(Continued)

FOREIGN PATENT DOCUMENTS

CN 1674364 A 9/2005
CN 101056529 A 10/2007

(Continued)

OTHER PUBLICATIONS

Communication dated Apr. 22, 2019, from the China National Intellectual Property Administration in counterpart Application No. 201680079486.X.

(Continued)

*Primary Examiner* — Xiaoliang Chen
(74) *Attorney, Agent, or Firm* — Sughrue Mion, PLLC

(57) ABSTRACT

The fitting structure for a conductive sheet of this invention comprises: a conductive member which is arranged within a predetermined region in a front case of an electronic device that has the front case and a rear case, said cases being first and second case pieces that are separably joined to each other, and which is electrically connected to ground patterns of the electronic device; and a conductive sheet which is arranged within the rear case so as to face the predetermined region of the front case and comprises a conductive layer. In a state where the front case and the rear case are joined with each other, the conductive layer of the conductive sheet is in contact with the conductive member and is electrically connected to the ground patterns of the electronic device.

18 Claims, 11 Drawing Sheets

32 31 33 322 37 36 38

(51) Int. Cl.

| | |
|---|---|
| ***H05K 5/00*** | (2006.01) |
| ***H01Q 1/24*** | (2006.01) |
| ***H01Q 1/48*** | (2006.01) |
| ***H05K 3/00*** | (2006.01) |
| ***H05K 3/02*** | (2006.01) |

(58) Field of Classification Search

CPC .......... H05K 3/301; H05K 3/341; H05K 5/00; H04M 1/185; H04M 1/0214; H04M 1/0202; H04M 1/0277; H01Q 1/24; H01Q 1/48; H01Q 1/243

USPC ......... 361/748, 679.01, 752; 341/20, 22, 33; 343/702; 439/607.15

See application file for complete search history.

(56) References Cited

U.S. PATENT DOCUMENTS

| | | | | |
|---|---|---|---|---|
| 2002/0126464 | A1 | 9/2002 | Nakamura et al. | |
| 2005/0181673 | A1* | 8/2005 | D'Ambrosia ...... | H01R 13/6477 439/607.15 |
| 2010/0157553 | A1* | 6/2010 | Hirota .................. | H04M 1/185 361/752 |
| 2010/0245178 | A1* | 9/2010 | Hsieh ...................... | H01Q 1/48 343/702 |
| 2016/0242289 | A1* | 8/2016 | Kim ................... | H04M 1/0202 |

FOREIGN PATENT DOCUMENTS

| | | | |
|---|---|---|---|
| JP | 58-180697 | U | 12/1983 |
| JP | 60-77568 | U | 5/1985 |
| JP | 2-92993 | U | 7/1990 |
| JP | 6-152175 | A | 5/1994 |
| JP | 2001-267778 | A | 9/2001 |
| JP | 2010-267928 | A | 11/2010 |
| JP | 2013-098273 | A | 5/2013 |
| JP | 2016-025634 | A | 2/2016 |
| WO | 2014/045671 | A1 | 3/2014 |

OTHER PUBLICATIONS

International Search Report for PCT/JP2016/087193 dated Mar. 7, 2017 [PCT/ISA/210].

Written Opinion for PCT/JP2016/087193 dated Mar. 7, 2017 [PCT/ISA/237].

* cited by examiner

FIG. 2A
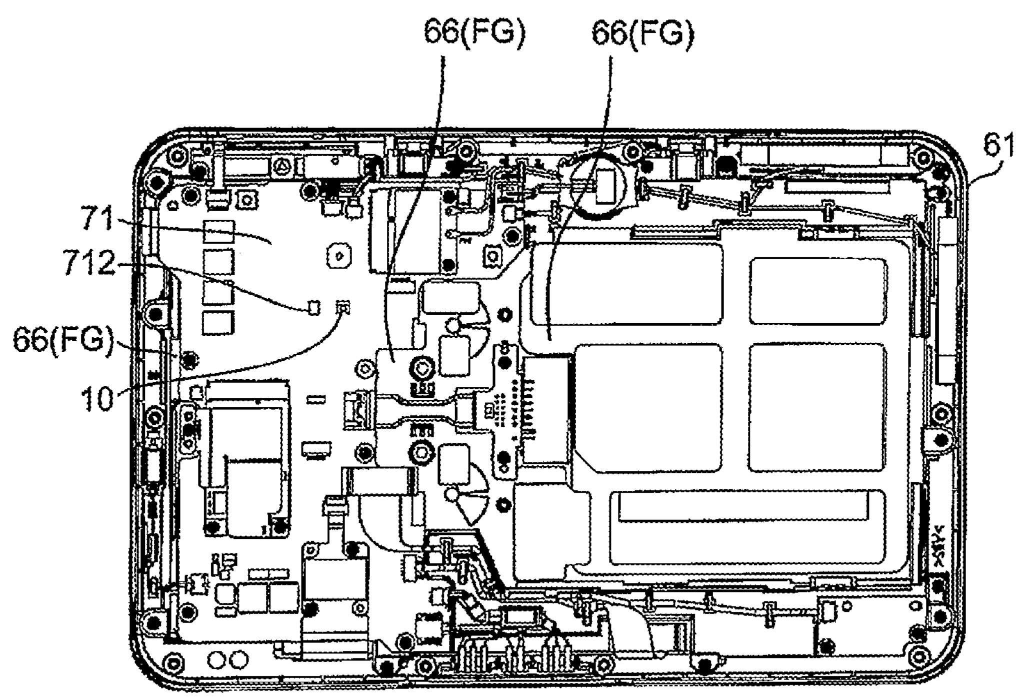
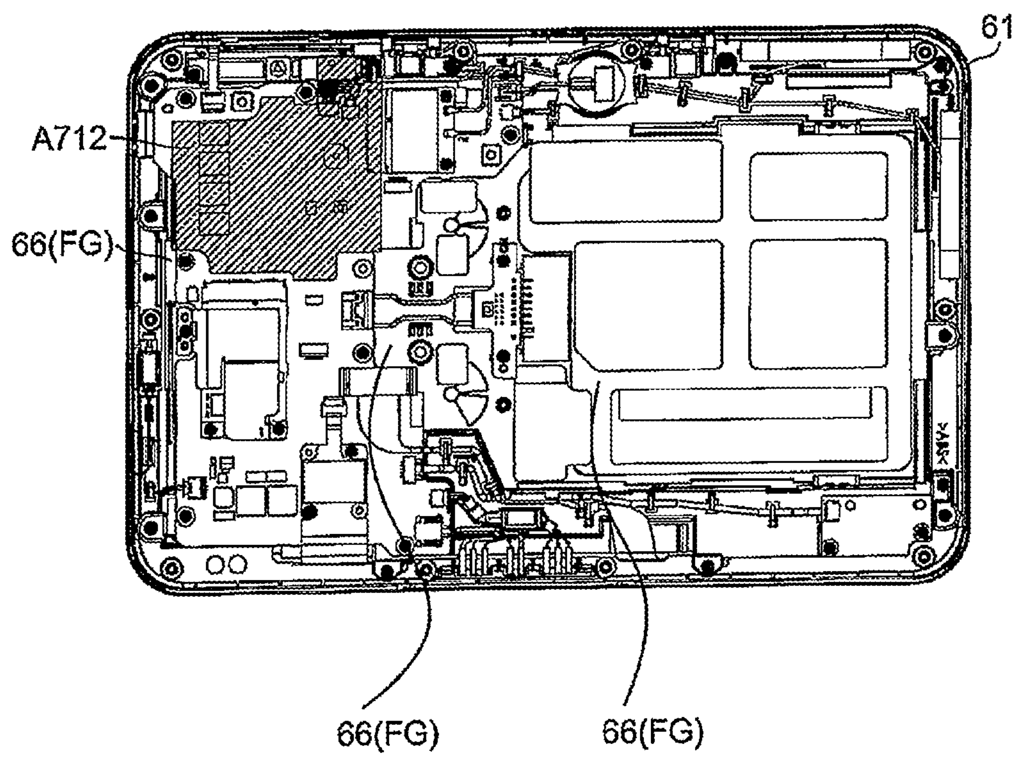
FIG. 2B

FIG. 3A
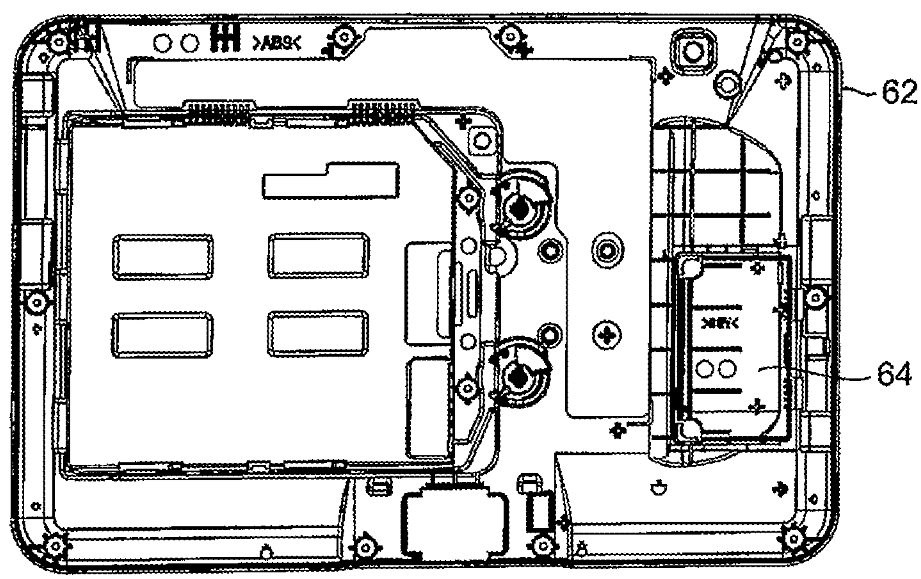
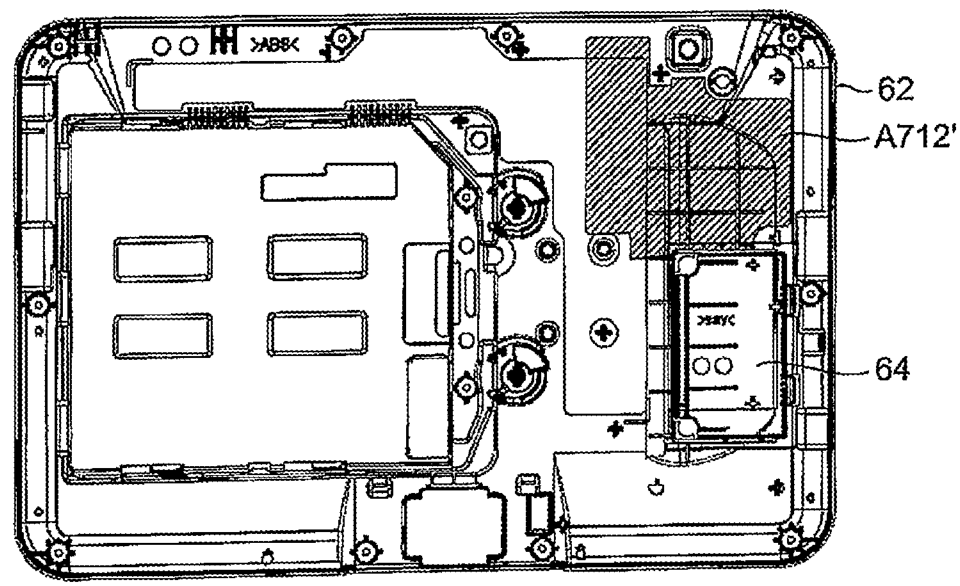
FIG. 3B

FIG. 4A
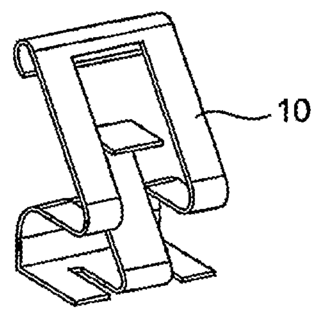
FIG. 4B
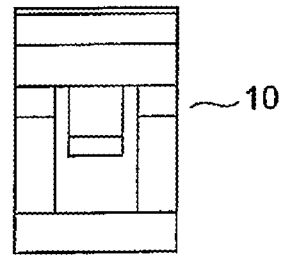
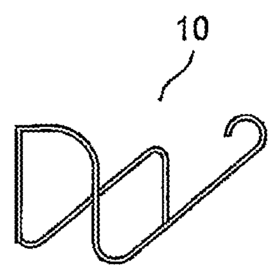
FIG. 4E
FIG. 4C
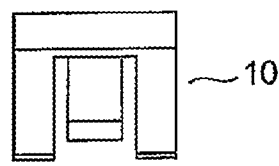
FIG. 4D
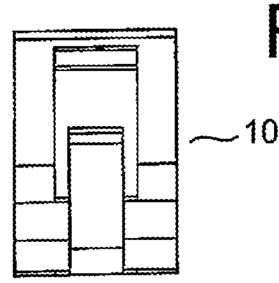

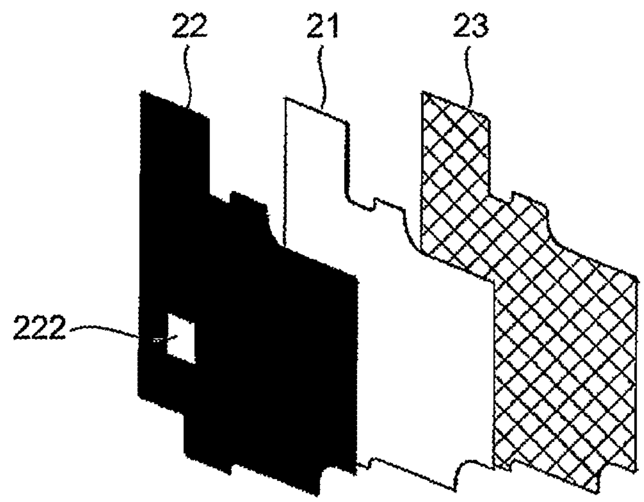
FIG. 6
FIG. 7A
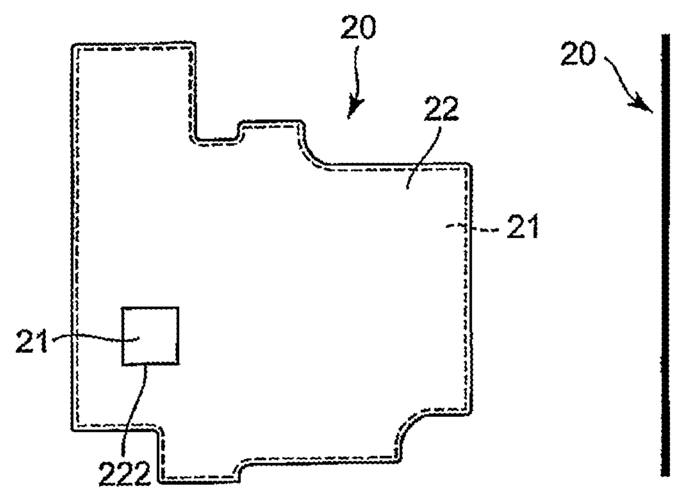
FIG. 7C
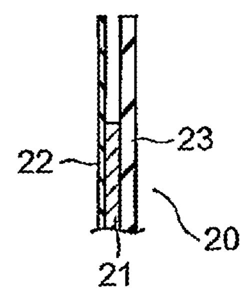
FIG. 7B

FIG. 10
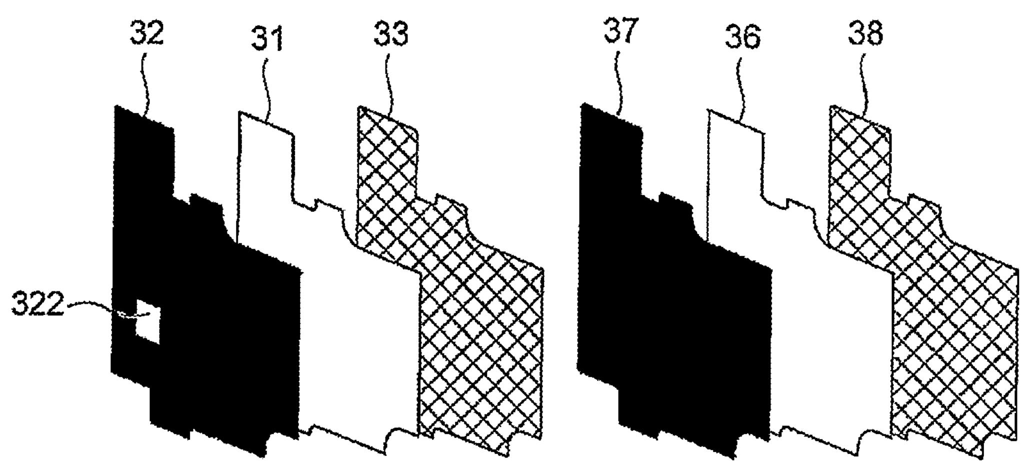
FIG. 11A
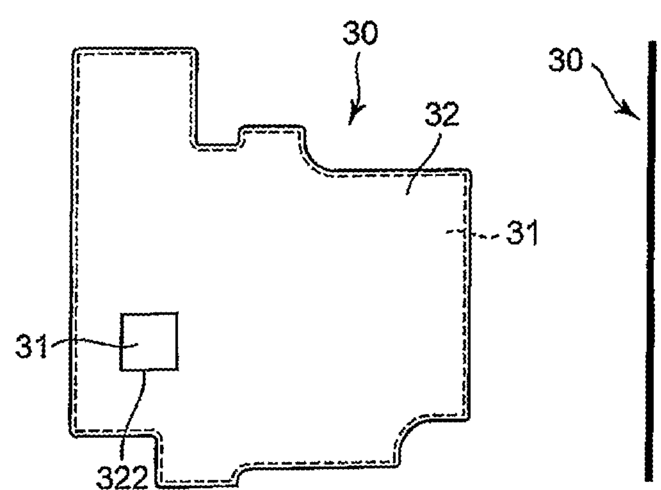
FIG. 11C
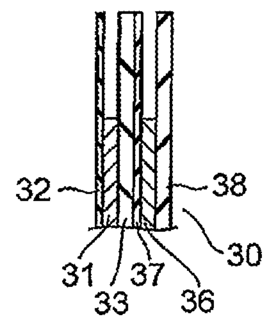
FIG. 11B

FITTING STRUCTURE FOR CONDUCTIVE SHEET AND ELECTRONIC DEVICE

CROSS REFERENCE TO RELATED APPLICATIONS

This application is a National Stage of International Application No. PCT/JP2016/087193, filed on Dec. 14, 2016, which claims priority from Japanese Patent Application No. 2016-022673, filed on Feb. 9, 2016, the entire disclosure of which is incorporated herein by reference.

TECHNICAL FIELD

This invention relates to a fitting structure for a conductive sheet in an electronic device, and the electronic device.

BACKGROUND ART

In general, in an electronic device, it is sometimes required that a conductive sheet having electrical conductivity with a ground pattern of the electronic device be arranged in a predetermined region of a case of the electronic device as countermeasures for preventing a malfunction and the like of the electronic device caused by an extrinsic noise coming from outside.

In Patent Document 1, there is disclosed a structure for fitting a conductive sheet through use of protrusions or claws formed on an inner side surface of a case piece of an electronic device.

PRIOR ART DOCUMENT(S)

Patent Document(s)

Patent Document 1: JP H06-152175 A

SUMMARY OF THE INVENTION

Problem to be Solved by the Invention

However, in Patent Document 1, there is no description on bringing the conductive sheet into conduction with a ground pattern of the electronic device. That is, a technology disclosed in Patent Document 1 does not satisfy the demand for forming the conductive sheet having electrical conductivity with the ground pattern of the electronic device in a predetermined region of the case of the electronic device.

This invention has been made to provide a technology for solving the above-mentioned problem, and an object of this invention is to provide a fitting structure for a conductive sheet enabling a conductive sheet having electrical conductivity with a ground pattern to be arranged in a predetermined region of a case of an electronic device.

Means to Solve the Problem

According to an aspect of this invention, there is provided a fitting structure for a conductive sheet, comprising a conductive member, which is arranged in a predetermined region of a first case piece of an electronic device that includes the first case piece and a second case piece, the first case piece and the second case piece being separably coupled to each other, and is electrically connected to a ground pattern of the electronic device; and a conductive sheet, which includes a conductive layer, and is arranged in the second case piece so as to be opposed to the predetermined region of the first case piece, wherein, under a state in which the first case piece and the second case piece are coupled to each other, the conductive layer of the conductive sheet is brought into contact with the conductive member and is electrically connected to the ground pattern of the electronic device.

According to another aspect of this invention, there is provided an electronic device, including the fitting structure for a conductive sheet, the first case piece, the second case piece, and the ground pattern.

Effect of the Invention

According to this invention, it is possible to provide the fitting structure for a conductive sheet enabling the conductive sheet having electrical conductivity with the ground pattern of the electronic device to be arranged in the predetermined region of the case of the electronic device.

BRIEF DESCRIPTION OF THE DRAWING

FIGS. 2A and 2B each of which is a plan view of a front case being a first case piece of the electronic device, when viewed from a side that is in contact with a rear case being a second case piece.

FIGS. 3A and 3B each of which is a plan view of the rear case being the second case piece of the electronic device, when viewed from a side that is in contact with the front case being the first case piece.

FIGS. 4A, 4B, 4C, 4D, and 4E which are a perspective view, a rear view, a top view, a front view and a side view of a conductive member in the fitting structure for a conductive sheet according to the first embodiment and the second embodiment of this invention, respectively.

FIG. 6 is an exploded perspective view of a conductive sheet in the fitting structure for a conductive sheet according to the first embodiment of this invention.

FIGS. 7A, 7B and 7C which are a plan view, a side view, and an enlarged view of an end portion of the conductive sheet in the fitting structure for a conductive sheet according to the first embodiment of this invention, respectively.

FIG. 10 is an exploded perspective view of a conductive sheet in the fitting structure for a conductive sheet according to the second embodiment of this invention.

FIGS. 11A, 11B and 11C which are a plan view, a side view and an enlarged view of an end portion of the conductive sheet in the fitting structure for a conductive sheet according to the second embodiment of this invention, respectively.

MODES FOR EMBODYING THE INVENTION

A fitting structure for a conductive sheet according to embodiments of this invention includes a conductive member and a conductive sheet.

The conductive member is arranged in a predetermined region of a first case piece of an electronic device that includes the first case piece and a second case piece, the first case piece and the second case piece being separably coupled to each other, and is electrically connected to a ground pattern of the electronic device provided in the first case piece.

The conductive sheet is arranged in the second case piece so as to be opposed to the predetermined region of the first case piece and includes a conductive layer.

The conductive layer of the conductive sheet is brought into contact with the conductive member under a state in which the first case piece and the second case piece are coupled to each other, thereby being electrically connected to the ground pattern of the electronic device.

According to this invention, with the above-mentioned configuration, the conductive sheet having electrical conductivity with the ground pattern of the electronic device can be arranged in a predetermined region of the case of the electronic device.

Now, with reference to the drawings, a fitting structure for a conductive sheet according to more specific embodiments of this invention is described.

First Embodiment

A fitting structure for a conductive sheet according to a first embodiment of this invention is an example that is applied to, as an electronic device, a tablet-type portable terminal device to be used in a self-ordering system being one form of a point of sales (POS) system.

The fitting structure for a conductive sheet according to the first embodiment includes a conductive member described later and a conductive sheet.

Figure 1B:
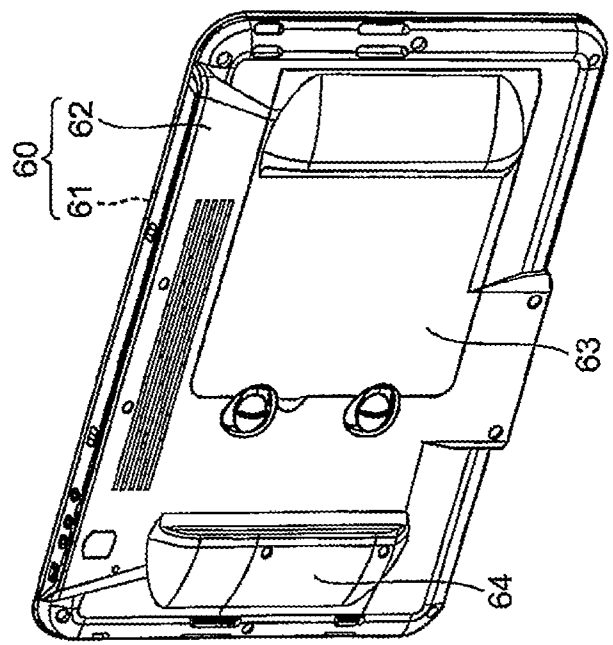
FIGS. 1A and 1B are perspective views of a portable terminal device being an electronic device to which a fitting structure for a conductive sheet according to a first embodiment and a second embodiment of this invention is applied, when viewed from a front surface side and when viewed from a rear surface side, respectively.
Figure 1A:
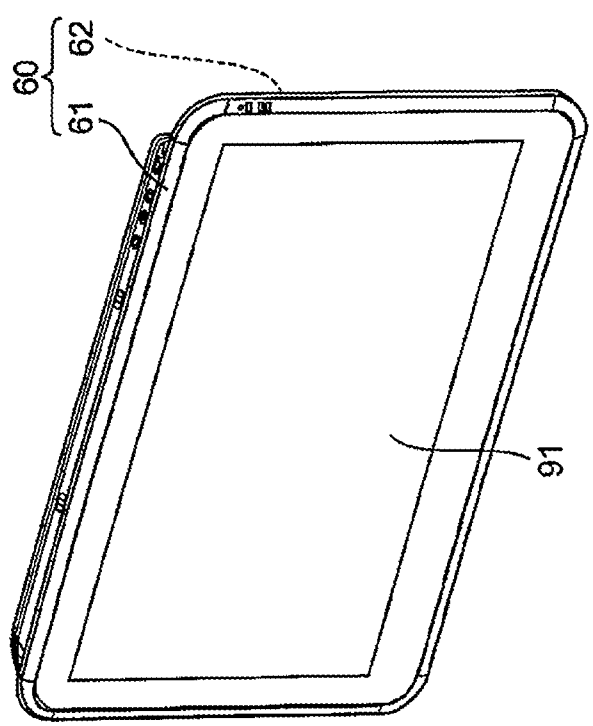

As illustrated in FIG. 1A and FIG. 1B, the portable terminal device includes a case 60. The case 60 includes a front case 61 being a first case piece and a rear case 62 being a second case piece, which are separably coupled to each other. The front case 61 and the rear case 62 are each a resin molded article.

A display 91 with a touch panel is provided on the front case 61.

Meanwhile, the rear case 62 includes a battery accommodating portion lid 63 and a solid state drive (SSD) accommodating portion lid 64.

As illustrated in FIG. 2A, in the front case 61, there are provided, for example, a case frame 66 made of a magnesium alloy having a low electric resistivity and a substrate assembly 71 in which a control portion formed of an electronic device including a crystal oscillator 712, an SSD accommodating portion, and the like are mounted on a circuit board of a laminated substrate type.

The case frame 66 is made of a metal as described above and serves not only as a fitting member but also as a frame ground FG in terms of a potential. The case frame 66 is screwed to the front case 61 at a plurality of positions.

The substrate assembly 71 is screwed to the case frame 66 at a plurality of positions. The substrate assembly 71 includes the circuit board of a laminated substrate type. A ground pattern which serves as a signal ground pattern described later and a land pattern which is electrically connected to the ground pattern through a through hole (via hole), that is, which has the same potential as that of the signal ground pattern are formed on the circuit board. A conductive member 10 is fixed to the land pattern by soldering and is electrically connected to the signal ground pattern.

A region A712 in FIG. 2B is a region which has the crystal oscillator 712 and the like mounted thereon and in which the operation may be influenced by an extrinsic noise, that is, a region in which the conductive sheet having electrical conductivity with the ground pattern is required to be arranged so as to be opposed to the region as countermeasures against an extrinsic noise in the first embodiment. The conductive member 10 soldered to the land pattern is positioned in the region A712.

Meanwhile, as illustrated in FIG. 3A and FIG. 3B, the rear case 62 includes the battery accommodating portion lid 63 (FIG. 2B) and the solid state drive (SSD) accommodating portion lid 64.

A region A712' in FIG. 3B is a region that is opposed to the region A 712 (FIG. 2B) in the front case 61 when the rear case 62 is coupled to the front case 61. That is, the region A712' is a region in which the conductive sheet in the fitting structure for a conductive sheet according to the first embodiment is arranged so as to be opposed to the region as countermeasures against an extrinsic noise.

Figures 5A, 5B, 5C:
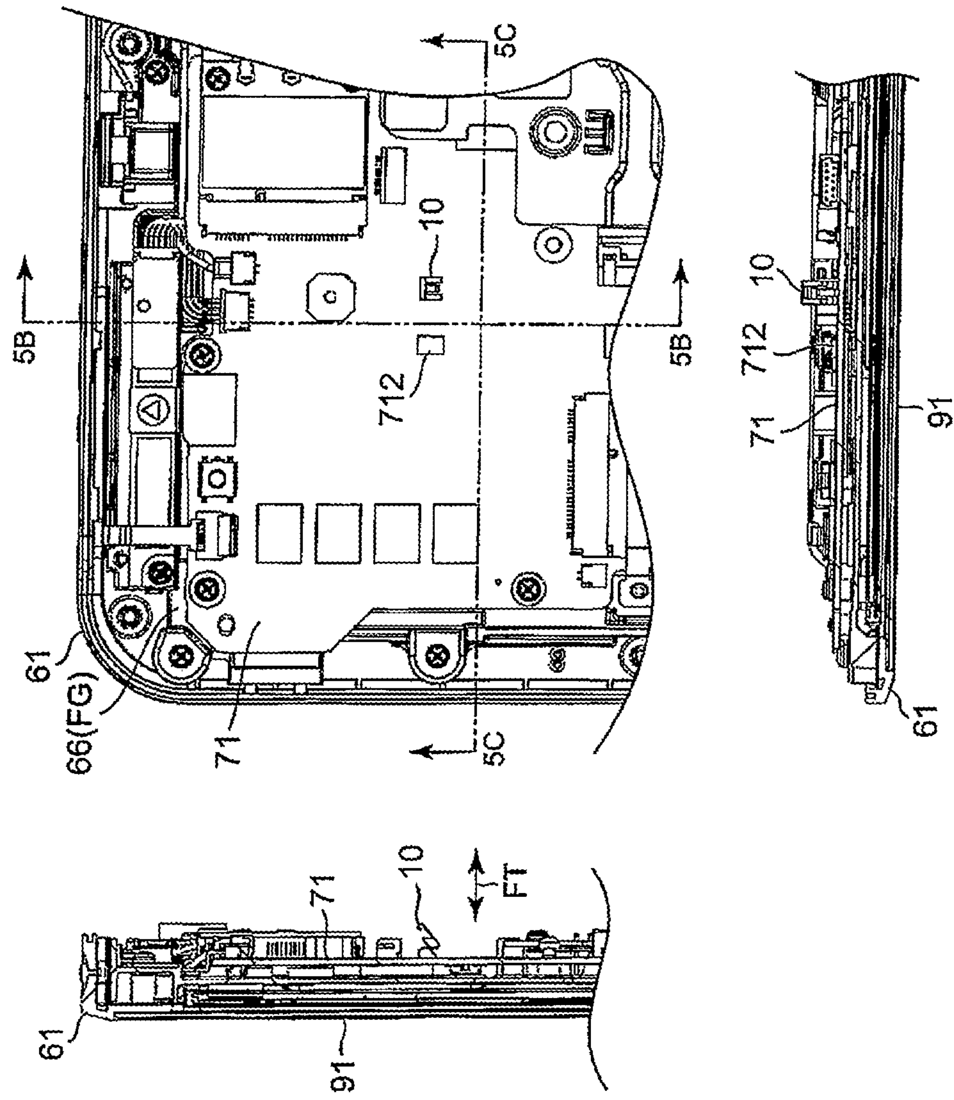
FIGS. 5A, 5B and 5C which are a partial plan view of the first case piece of the electronic device accommodating a substrate assembly 71 having the conductive member mounted thereon, a view taken along the section line 5B-5B, and a view taken along the section line 5C-5C, respectively.

The conductive member 10 forming the fitting structure for a conductive sheet according to the first embodiment is made of a metal having elasticity and exhibits a shape as illustrated in FIG. 4A to 4E. Further referring to FIG. 5A to 5C, the conductive member 10 is soldered to the land pattern formed in the region A712 (FIG. 2B) of the surface of the substrate assembly 71 in which the operation may be influenced by an extrinsic noise. The conductive member 10 has elasticity in a coupling direction FT of the front case 61 and the rear case 62.

Meanwhile, referring to FIG. 6 and FIG. 7A to 7C, a conductive sheet 20 forming the fitting structure for a conductive sheet according to the first embodiment together with the conductive member 10 includes three layers, specifically, a first insulating layer 22, a conductive layer 21, and a second insulating layer 23 that are laminated in the stated order.

The first insulating layer 22 is formed of a polyethylene terephthalate (PET) film. It is only required that a material for the first insulating layer 22 have insulating properties, and, for example, polyvinyl chloride and polypropylene may be used. The first insulating layer 22 includes a cutout portion 222, and a part of the surface of the conductive layer 21 is exposed from the cutout portion 222. One surface of the first insulating layer 22 is caused to adhere to the conductive layer 21 through use of an adhesive or a double-sided pressure-sensitive adhesive tape.

The conductive layer 21 is formed of an aluminum sheet.

The second insulating layer 23 is formed of a double-sided pressure-sensitive adhesive tape including an insulating base sheet and pressure-sensitive adhesive layers formed respectively on both sheet surfaces of the base sheet. The second insulating layer 23 is mainly bonded to the insulating rear case 62 and is not required to have such high insulating properties as those of the first insulating layer 22. Therefore, the thickness of the base sheet may be smaller than that of the first insulating layer 22.

As is understood from FIGS. 7A and 7C, the conductive layer 21 has an outer shape in plan view smaller than those of the first insulating layer 22 and the second insulating layer 23 across an outer periphery. That is, the first insulating layer 22 and the second insulating layer 23 each include a peripheral edge portion extending outward from the conductive layer 21. Although the peripheral edge portions of the first insulating layer 22 and the second insulating layer 23 are separated from each other in FIG. 7C, it is preferred that the peripheral edge portions adhere to each other when the conductive sheet 20 is bonded to the rear case 62 at the latest and thereafter. With this, the conductive layer 21 including a peripheral edge portion thereof is sealed with the insulating layers except for the cutout portion 222. Therefore, the conductive layer 21 can be reliably prevented from being short-circuited with a device or a region in the portable terminal device having a potential different from a ground potential. The second insulating layer 23 may be a pressure-sensitive adhesive film. In this case, the periphery of the conductive layer 21 is prevented from being exposed by joining the peripheral edge portions of the first insulating layer 22 and the second insulating layer 23 to each other with an adhesive or the like or by sealing the edge portions with a substance having insulating properties.

Figure 8:
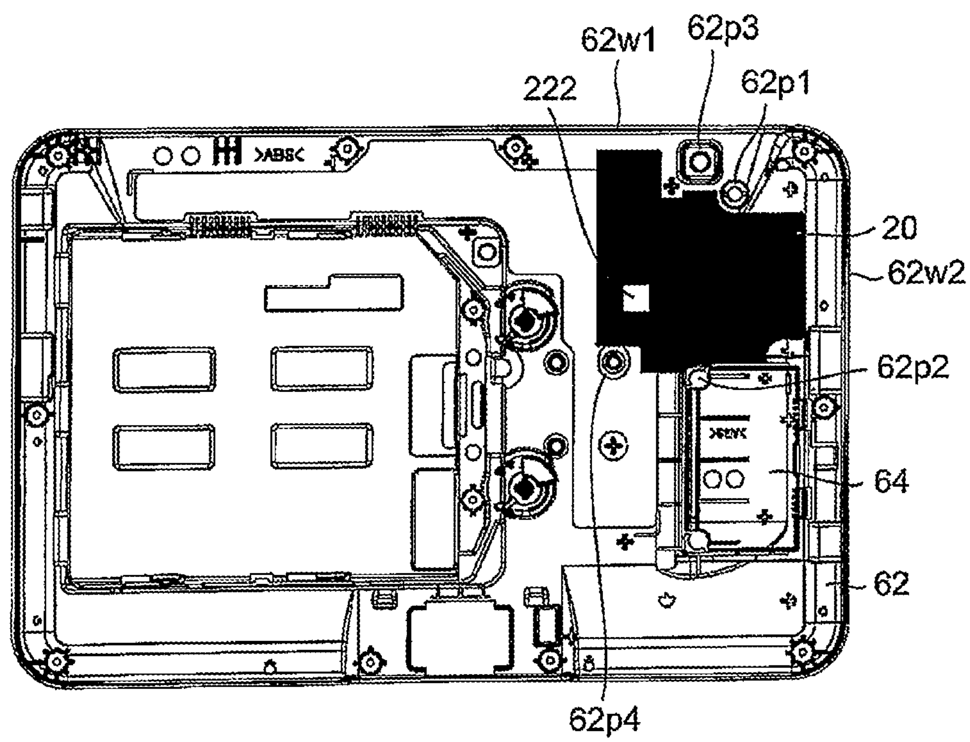
FIG. 8 is a plan view of the rear case being the second case piece of the electronic device in which the conductive sheet in the fitting structure for a conductive sheet according to the first embodiment of this invention is arranged, when viewed from a side that is in contact with the front case being the first case piece.

As illustrated in FIG. 8, the second insulating layer 23 side of the conductive sheet 20 is bonded to the region A712' (FIG. 3B) of the rear case 62. The conductive sheet 20 is positioned by guidance of protrusions 62*p*1 to 62*p*4 and the like in the rear case 62 so that the conductive sheet 20 is properly bonded to the region A712'. The protrusion 62*p*3 is a rear side of a screw fastening boss formed in order to screw the SSD accommodating portion lid 64 from outside of the rear case 62. None of the protrusions 62*p*1 to 62*p*4 is formed so as to position the conductive sheet 20. When suitable protrusions are not present on the periphery of a region of the rear case 62 in which the conductive sheet is to be arranged, for example, peripheral edge wall portions 62*w*1 and 62*w*2 of the rear case 62 may be used for positioning of the conductive sheet 20. In this case, it is required that the outer shape of the conductive sheet 20 be extended to the peripheral edge wall portions of the rear case. Alternatively, the following may be possible. A positioning sheet marked with positions at which the conductive sheet is to be bonded is prepared, and the positioning sheet is bonded with reference to the peripheral edge wall portions of the rear case. After that, the conductive sheet is bonded to bonding positions shown on the positioning sheet. The conductive sheet 20 has flexibility. Therefore, when a surface to which the conductive sheet 20 is bonded is a curved surface, the conductive sheet 20 can be bonded so as to follow the curved surface.

Figure 9:
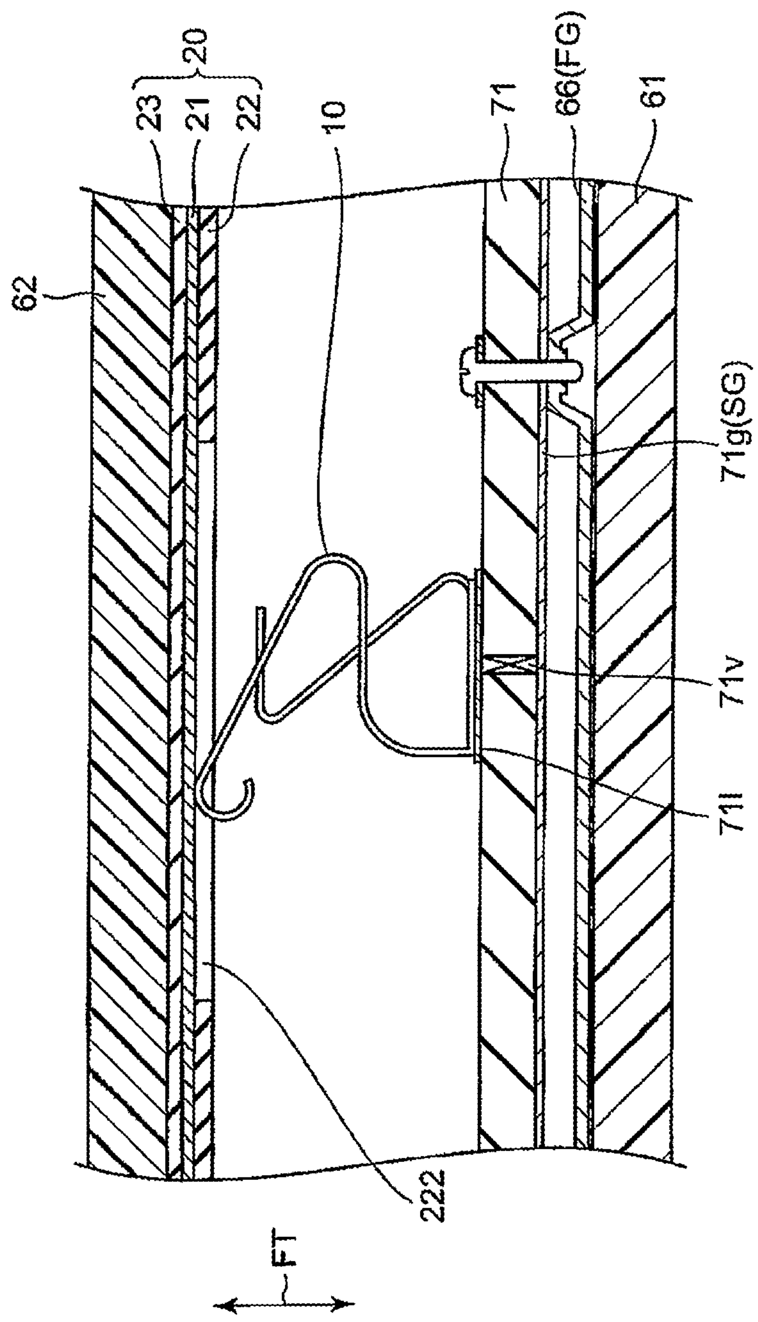
FIG. 9 is a sectional view of the fitting structure for a conductive sheet according to the first embodiment of this invention.

FIG. 9 is a sectional view of main portions in the first embodiment when the front case 61 and the rear case 62 are coupled to each other. FIG. 9 is a view for easy understanding of this invention, and the shape and dimension ratio of each portion are not drawn accurately. Further, in general, an insulating solder resist film is formed on a surface of the substrate assembly (circuit board) excluding the land pattern and the like, but the insulating solder resist film is not shown in FIG. 9.

Referring to FIG. 9, the case frame 66 is screwed to the front case 61 being the first case piece at a plurality of positions (not shown). The case frame 66 electrically serves as the frame ground FG.

Further, the substrate assembly 71 is screwed to the case frame 66 at a plurality of positions including one illustrated position. A ground pattern 71*g* is formed on a lower side surface of the substrate assembly 71. The ground pattern 71*g* is a signal ground SG of the substrate assembly 71. The ground pattern 71*g* is held in contact with the case frame 66 at a plurality of screwed positions including one illustrated position. That is, the signal ground SG is electrically connected to the frame ground FG, and both the signal ground SG and the frame ground FG have the same potential.

A land pattern 71*l* is formed in the region A712 (FIG. 2B) of an upper side surface of the substrate assembly 71. The land pattern 71*l* is electrically connected to the ground pattern 71*g* through a through hole 71*v*. That is, the land pattern 71*l* is electrically connected to the signal ground SG and further to the frame ground FG, and the land pattern 71*l*, the signal ground SG, and the frame ground FG have the same potential.

The conductive member 10 is soldered to the land pattern 71*l*. That is, the conductive member 10 is mechanically fixed to the substrate assembly 71, and is electrically connected to the ground pattern 71*g* (signal ground SG) and further to the case frame 66 (frame ground FG) through the land pattern 71*l* and the through hole 71*v*. That is, the conductive member 10 has the same potential as those of the signal ground SG and the frame ground FG.

Meanwhile, the conductive sheet 20 is bonded to the region A712' (FIG. 3B) of the rear case 62 being the second case piece. The cutout portion 222 of the first insulating layer 22 of the conductive sheet 20 is formed at a position corresponding to the conductive member 10 on the front case 61 side when the front case 61 and the rear case 62 are coupled to each other.

As illustrated in FIG. 9, when coupling between the front case 61 and the rear case 62 is completed, the conductive layer 21 of the conductive sheet 20 arranged on the rear case 62 is brought into contact with the conductive member 10 arranged on the front case 61 to be electrically connected thereto through the cutout portion 222 of the first insulating layer 22.

Specifically, the conductive layer 21 of the conductive sheet 20 arranged on the rear case 62 is electrically connected to the ground pattern 71*g* (signal ground SG) and further to the case frame 66 (frame ground FG) through the conductive member 10, the land pattern 71*l*, and the through hole 71*v*. That is, the conductive layer 21 of the conductive sheet 20 has the same potential as those of the signal ground SG and the frame ground FG.

The conductive member 10 has elasticity in the coupling direction FT between the front case 61 and the rear case 62. Therefore, even when there is a variation in positional relationship between the conductive member 10 arranged on the front case 61 and the conductive layer 21 of the conductive sheet 20 arranged on the rear case 62, the variation is cancelled by a shrinkage allowance (margin) of the conductive member 10 involving elasticity. Thus, the conductive member 10 and the conductive layer 21 are reliably brought into contact with each other to be electrically connected to each other. In the first embodiment, the interval between the upper surface of the substrate assembly 71 and the conductive sheet 20 is about 5 mm. Further, the conductive member 10 has a shape in which a cantilever beam extending obliquely has a contact portion at a distal end. Therefore, in the process of coupling between the front case 61 and the rear case 62, the contact portion of the conductive member 10 is expected to exert a wiping action of removing an oxide film and contamination formed on the surface of the conductive layer 21.

As described above, according to the first embodiment of this invention, in the electronic device, the conductive sheet having electrical conductivity with the ground of the electronic device can be arranged in a predetermined region of the case.

Second Embodiment

A second embodiment of this invention is different from the first embodiment in structure of the conductive sheet. Regarding the portions in the second embodiment that are the same as or similar to those of the first embodiment, the figures and description in the first embodiment are incorporated, and illustration in figures and detailed description of those portions are omitted.

A fitting structure for a conductive sheet according to the second embodiment is also an example that is applied to, as an electronic device, a tablet-type portable terminal device to be used in a self-ordering system being one form of a POS system.

The fitting structure for a conductive sheet according to the second embodiment also includes, similarly to the first embodiment, the conductive member and the conductive sheet.

In particular, the configuration on the side of the front case being the first case including the conductive member is the same as that on the side of the front case 61 including the conductive member 10 in the first embodiment described with reference to FIG. 1, FIG. 2, FIG. 4, and FIG. 5.

Meanwhile, referring to FIG. 10 and FIG. 11A to 11C, a conductive sheet 30 forming the fitting structure for a conductive sheet according to the second embodiment of this invention together with the conductive member 10 includes six layers, specifically, a first insulating layer 32, a first conductive layer 31, a second insulating layer 33, a third insulating layer 37, a second conductive layer 36, and a fourth insulating layer 38 that are laminated in the stated order.

The first insulating layer 32 and the third insulating layer 37 are each formed of a PET film. It is only required that a material for the first insulating layer 32 have insulating properties, and, for example, polyvinyl chloride and polypropylene may be used. The first insulating layer 32 includes a cutout portion 322, and a part of the surface of the first conductive layer 31 is exposed from the cutout portion 322. One surface of the first insulating layer 32 is caused to adhere to the first conductive layer 31 through use of an adhesive or a double-sided pressure-sensitive adhesive tape.

The first conductive layer 31 and the second conductive layer 36 are each formed of an aluminum sheet.

Figure 12:
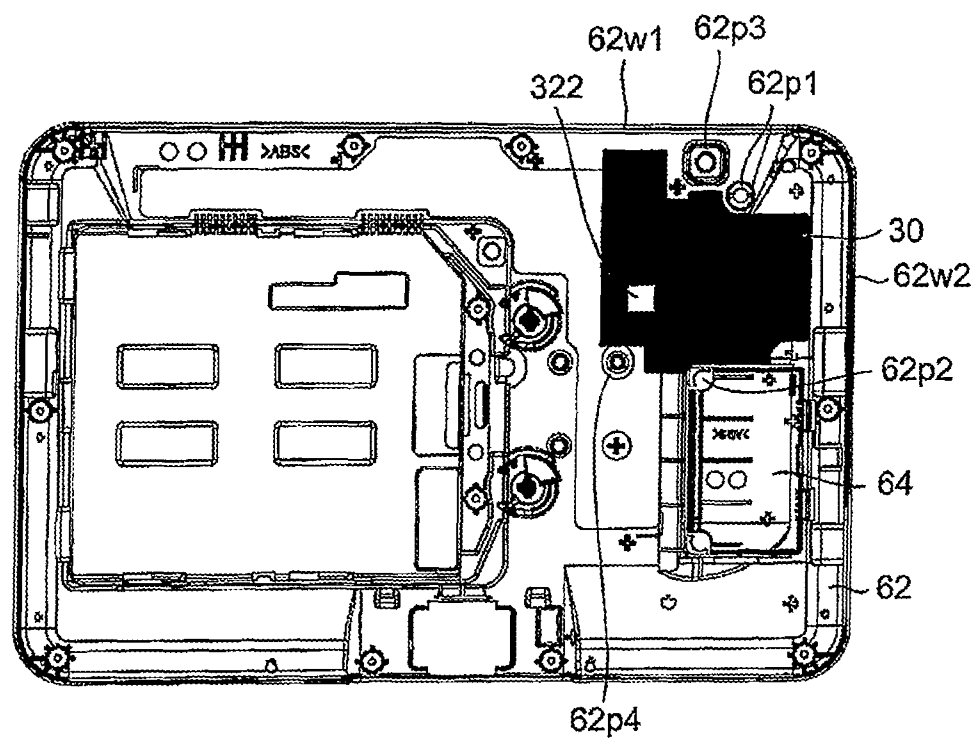
FIG. 12 is a plan view of the rear case being the second case piece of the electronic device in which the conductive sheet in the fitting structure for a conductive sheet according to the second embodiment of this invention is arranged, when viewed from a side that is in contact with the front case being the first case piece.

The second insulating layer 33 and the fourth insulating layer 38 are each formed of a double-sided pressure-sensitive adhesive tape including an insulating base sheet and pressure-sensitive adhesive layers formed respectively on both sheet surfaces of the base sheet. The second insulating layer 33 is bonded to the third insulating layer 37, and further, the fourth insulating layer 38 is mainly bonded to the insulating rear case 62 (FIG. 12). The second insulating layer 33 and the fourth insulating layer 38 are not required to have such high insulating properties as those of the first and third insulating layers 32 and 37. Therefore, the thicknesses of the base sheets of the second insulating layer 33 and the fourth insulating layer 38 may be smaller than those of the first and third insulating layers 32 and 37.

As is understood from FIGS. 11A and 11C, the first conductive layer 31 has an outer shape in plan view smaller than those of the first insulating layer 32 and the second insulating layer 33 across an outer periphery. That is, the first insulating layer 32 and the second insulating layer 33 each include a peripheral edge portion extending outward from the first conductive layer 31. Although the peripheral edge portions of the first insulating layer 32 and the second insulating layer 33 are separated from each other in FIG. 11C, it is preferred that the peripheral edge portions adhere to each other when the conductive sheet 30 is bonded to the rear case 62 at the latest and thereafter. With this, the first conductive layer 31 including a peripheral edge portion thereof is sealed with the insulating layers except for the cutout portion 322. Therefore, the first conductive layer 31 can be reliably prevented from being short-circuited with a device or a region in the portable terminal device having a potential different from a ground potential. The second insulating layer 33 may be a pressure-sensitive adhesive film. In this case, the periphery of the first conductive layer 31 is prevented from being exposed by joining the peripheral edge portions of the first insulating layer 32 and the second insulating layer 33 to each other with an adhesive or the like or by sealing the edge portions with a substance having insulating properties.

Similarly, as is understood from FIG. 11C, the second conductive layer 36 has an outer shape in plan view smaller than the third insulating layer 37 and the fourth insulating layer 38 across an outer periphery. That is, the third insulating layer 37 and the fourth insulating layer 38 each include a peripheral edge portion extending outward from the second conductive layer 36. Although the peripheral edge portions of the third insulating layer 37 and the fourth insulating layer 38 are separated from each other in FIG. 11C, it is preferred that the peripheral edge portions adhere to each other when the conductive sheet 30 is bonded to the rear case 62 at the latest and thereafter. With this, the second conductive layer 36 including a peripheral edge portion thereof is sealed with the insulating layers except for the cutout portion 322. Therefore, the second conductive layer 36 can be reliably prevented from being short-circuited with a device or a region in the portable terminal device having a potential different from a ground potential. The fourth insulating layer 38 may be a pressure-sensitive adhesive film. In this case, the periphery of the second conductive layer 36 is prevented from being exposed by joining the peripheral edge portions of the third insulating layer 37 and the fourth insulating layer 38 to each other with an adhesive or the like or by sealing the edge portions with a substance having insulating properties.

As illustrated in FIG. 12, the fourth insulating layer 38 side of the conductive sheet 30 is bonded to the region A712' (FIG. 3B) of the rear case 62. The conductive sheet 30 is positioned by guidance of the protrusions 62*p*1 to 62*p*4 and the like in the rear case 62 so that the conductive sheet 30 is properly bonded to the region A712'. The protrusion 62*p*3 is a rear side of a screw fastening boss formed in order to screw the SSD accommodating portion lid 64 from outside of the rear case 62. None of the protrusions 62*p*1 to 62*p*4 is formed so as to position the conductive sheet 30. When suitable protrusions are not present on the periphery of a region of the rear case 62 in which the conductive sheet is to be arranged, for example, the peripheral edge wall portions 62w1 and 62w2 of the rear case 62 may be used for positioning of the conductive sheet 30. In this case, it is required that the outer shape of the conductive sheet 30 be extended to the peripheral edge wall portions of the rear case. Alternatively, the following may be possible. A positioning sheet marked with positions at which the conductive sheet is to be bonded is prepared, and the positioning sheet is bonded with reference to the peripheral edge wall portions of the rear case. After that, the conductive sheet is bonded to bonding positions shown on the positioning sheet. The conductive sheet 30 has flexibility. Therefore, when a surface to which the conductive sheet 30 is bonded is a curved surface, the conductive sheet 30 can be bonded so as to follow the curved surface.

Figure 13:
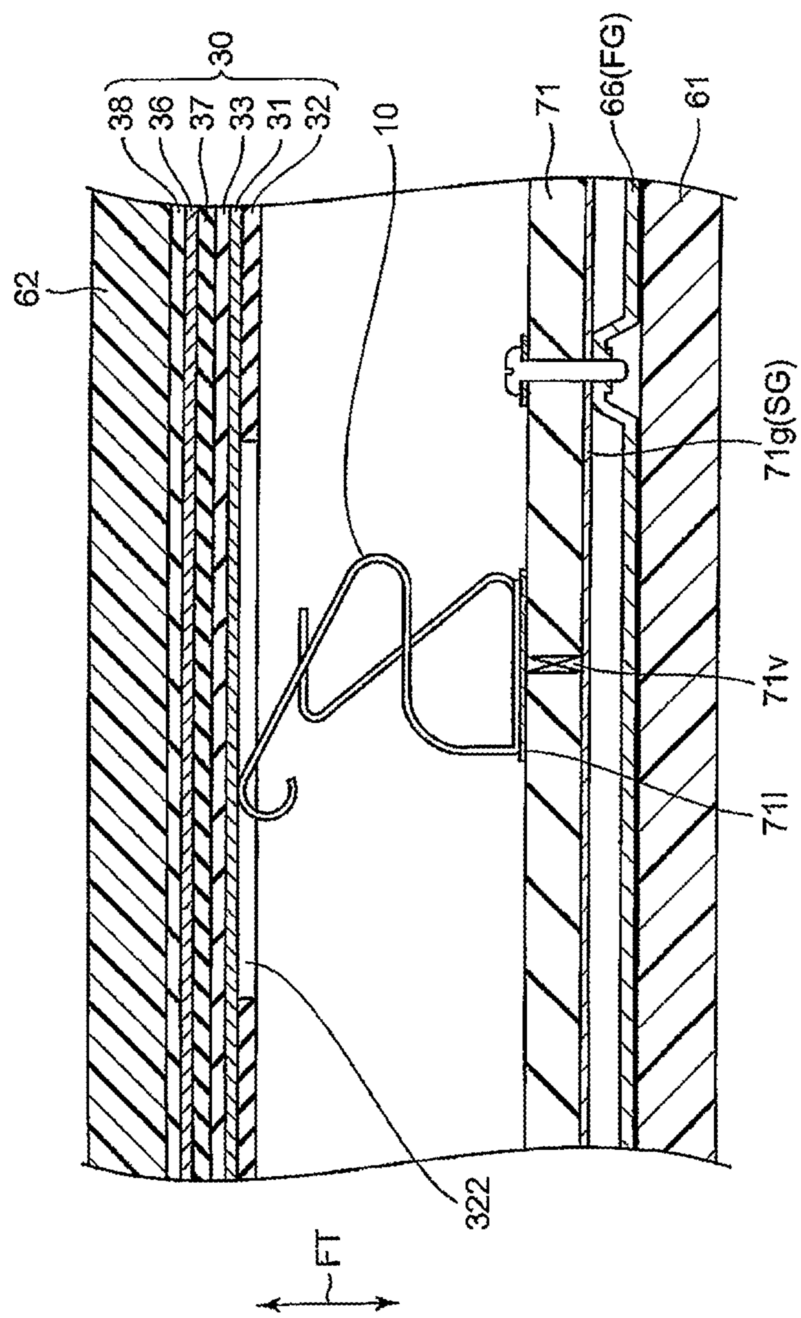
FIG. 13 is a sectional view of the fitting structure for a conductive sheet according to the second embodiment of this invention.

FIG. 13 is a sectional view of main portions in the second embodiment when the front case 61 and the rear case 62 are coupled to each other. FIG. 13 is a view for easy understanding of this invention, and the shape and dimension ratio of each portion are not drawn accurately. Further, in general, an insulating solder resist film is formed on a surface of the substrate assembly (circuit board) excluding the land pattern and the like, but the insulating solder resist film is not shown in FIG. 13.

Referring to FIG. 13, similarly to the first embodiment described with reference to FIG. 9, the case frame 66 is screwed to the front case 61 being the first case piece at a plurality of positions (not shown). The case frame 66 electrically serves as the frame ground FG.

Further, similarly to the first embodiment, the substrate assembly 71 is screwed to the case frame 66 at a plurality of positions including one illustrated position. The ground pattern 71g is formed on the lower side surface of the substrate assembly 71. The ground pattern 71g is the signal ground SG of the substrate assembly 71. The ground pattern 71g is held in contact with the case frame 66 at a plurality of screwed positions including one illustrated position. That is, the signal ground SG is electrically connected to the frame ground FG, and both the signal ground SG and the frame ground FG have the same potential.

Similarly to the first embodiment, the land pattern 71l is formed in the region A712 (FIG. 2B) of the upper side surface of the substrate assembly 71. The land pattern 71l is electrically connected to the ground pattern 71g through the through hole 71v. That is, the land pattern 71l is electrically connected to the signal ground SG and further to the frame ground FG, and the land pattern 71l, the signal ground SG, and the frame ground FG have the same potential.

Similarly to the first embodiment, the conductive member 10 is soldered to the land pattern 71l. That is, the conductive member 10 is mechanically fixed to the substrate assembly 71, and is electrically connected to the ground pattern 71g (signal ground SG) and further to the case frame 66 (frame ground FG) through the land pattern 71l and the through hole 71v. That is, the conductive member 10 has the same potential as those of the signal ground SG and the frame ground FG.

Meanwhile, the conductive sheet 30 is bonded to the region A712' (FIG. 3B) of the rear case 62 being the second case piece. The cutout portion 322 of the first insulating layer 32 of the conductive sheet 30 is formed at a position corresponding to the conductive member 10 on the front case 61 side when the front case 61 and the rear case 62 are coupled to each other.

As illustrated in FIG. 13, when coupling between the front case 61 and the rear case 62 is completed, the first conductive layer 31 of the conductive sheet 30 arranged on the rear case 62 is brought into contact with the conductive member 10 arranged on the front case 61 to be electrically connected thereto through the cutout portion 322 of the first insulating layer 32.

Specifically, the first conductive layer 31 of the conductive sheet 30 arranged on the rear case 62 is electrically connected to the ground pattern 71g (signal ground SG) and further to the case frame 66 (frame ground FG) through the conductive member 10, the land pattern 71l, and the through hole 71v. That is, the first conductive layer 31 of the conductive sheet 30 has the same potential as those of the signal ground SG and the frame ground FG.

Of the two conductive layers of the conductive sheet 30, the second conductive layer 36 opposed to the first conductive layer 31 with the second insulating layer 33 and the third insulating layer 37 interposed therebetween is not brought into contact with the conductive member 10 or is not electrically connected thereto. Thus, the second conductive layer 36 is not electrically connected to the signal ground SG or the frame ground FG.

Similarly to the first embodiment, the conductive member 10 has elasticity in the coupling direction FT between the front case 61 and the rear case 62. Therefore, even when there is a variation in positional relationship between the conductive member 10 arranged on the front case 61 and the first conductive layer 31 of the conductive sheet 30 arranged on the rear case 62, the variation is cancelled by a shrinkage allowance (margin) of the conductive member 10 involving elasticity. Thus, the conductive member 10 and the first conductive layer 31 are reliably brought into contact with each other to be electrically connected to each other. Also in the second embodiment, the interval between the upper surface of the substrate assembly 71 and the conductive sheet 30 is about 5 mm. Further, the conductive member 10 has a shape in which a cantilever beam extending obliquely has a contact portion at a distal end. Therefore, in the process of coupling between the front case 61 and the rear case 62, the contact portion of the conductive member 10 is expected to exert a wiping action of removing an oxide film and contamination formed on the surface of the first conductive layer 31.

As described above, also according to the second embodiment of this invention, in the electronic device, the conductive sheet having electrical conductivity with the ground of the electronic device can be arranged in a predetermined region of the case.

In the above-mentioned embodiments, the fitting structure for a conductive sheet is described as a structure for preventing a malfunction and the like of the electronic device caused by an extrinsic noise. However, the fitting structure for a conductive sheet can also be applied as a structure for reducing or suppressing an electromagnetic wave that is unintentionally radiated from the electronic device, that is, an unnecessary electromagnetic wave from the electronic device itself.

Further, the conductive member in this invention is not limited to the one obtained by subjecting one metal plate having elasticity to sheet-metal processing as in the above-mentioned embodiments. That is, the conductive member may be a conductive member formed of a plurality of components, for example, a combination of a movable contact point and a spring as in a probe pin.

Further, it is only required that the conductive layer in the conductive sheet have electrical conductivity and surface spread across a predetermined region. For example, the conductive layer may be made of copper or may be a textured sheet in which metallic yarns are knitted.

Further, in the above-mentioned embodiments, the conductive sheet is positioned through use of existing protruding shapes or protrusions of the case of the electronic device. However, protruding shapes or protrusions dedicated for positioning the conductive sheet may be formed on the case.

Further, in the above-mentioned embodiments, the conductive layer of the conductive sheet is electrically connected to the frame ground through the signal ground. However, when it is possible to take measures against an extrinsic noise by connecting the conductive layer to only the signal ground, the conductive layer may be connected to only the signal ground. Moreover, when it is possible to take measures against an extrinsic noise by connecting the conductive layer to only the frame ground, the conductive layer may be connected to only the frame ground. In this case, it is required that a frame ground pattern that is not electrically connected to the signal ground pattern be formed on the substrate assembly.

A part or all of the above-mentioned embodiments may be described in the following supplementary notes, but are not limited to the following supplementary notes.

(Supplementary Note 1)

A fitting structure for a conductive sheet, comprising:

a conductive member, which is arranged in a predetermined region of a first case piece of an electronic device that includes the first case piece and a second case piece, the first case piece and the second case piece being separably coupled to each other, and is electrically connected to a ground pattern of the electronic device; and a conductive sheet, which includes a conductive layer, and is arranged in the second case piece so as to be opposed to the predetermined region of the first case piece, wherein, under a state in which the first case piece and the second case piece are coupled to each other, the conductive layer of the conductive sheet is brought into contact with the conductive member and is electrically connected to the ground pattern of the electronic device.

(Supplementary Note 2)

A fitting structure for a conductive sheet according to supplementary note 1, wherein the conductive sheet includes a first insulating layer, the conductive layer, and a second insulating layer that are laminated on one another, wherein the first insulating layer includes a cutout portion for exposing a part of a surface of the conductive layer, wherein the second insulating layer is bonded to an inner side surface of the second case piece of the electronic device, and wherein, under a state in which the first case piece and the second case piece are coupled to each other, the conductive layer of the conductive sheet is brought into contact with the conductive member through the cutout portion of the first insulating layer and is electrically connected to the ground pattern of the electronic device.

(Supplementary Note 3)

A fitting structure for a conductive sheet according to supplementary note 1, wherein the conductive sheet includes a first insulating layer, a first conductive layer being the conductive layer, a second insulating layer, a third insulating layer, a second conductive layer, and a fourth insulating layer that are laminated on one another, wherein the first insulating layer includes a cutout portion for exposing a part of a surface of the first conductive layer, wherein the fourth insulating layer is bonded to an inner side surface of the second case piece of the electronic device, and wherein, under a state in which the first case piece and the second case piece are coupled to each other, the first conductive layer of the conductive sheet is brought into contact with the conductive member through the cutout portion of the first insulating layer and is electrically connected to the ground pattern of the electronic device.

(Supplementary Note 4)

A fitting structure for a conductive sheet according to any one of supplementary notes 1 to 3, wherein the conductive member has elasticity in a direction in which the first case piece and the second case piece of the electronic device are coupled to each other.

(Supplementary Note 5)

A fitting structure for a conductive sheet according to supplementary note 4, wherein the conductive member is made of a metal and is soldered to a land pattern that is formed on a substrate assembly mounted on the first case piece and has the same potential as a potential of the ground pattern of the electronic device.

(Supplementary Note 6)

A fitting structure for a conductive sheet according to any one of supplementary notes 1 to 5, wherein the conductive sheet is positioned through use of a protruding portion in the second case piece of the electronic device.

(Supplementary Note 7)

A fitting structure for a conductive sheet according to any one of supplementary notes 1 to 6, wherein the conductive sheet has flexibility.

(Supplementary Note 8)

A fitting structure for a conductive sheet according to any one of supplementary notes 2 and 4 to 7, wherein the conductive layer of the conductive sheet has an outer shape in plan view smaller than an outer shape of each of the first insulating layer and the second insulating layer across an outer periphery, wherein the first insulating layer and the second insulating layer each includes a peripheral edge portion extending outward from the conductive layer, and wherein the peripheral edge portion of the first insulating layer and the peripheral edge portion of the second insulating layer are joined to each other.

(Supplementary Note 9)

A fitting structure for a conductive sheet according to any one of supplementary notes 3 to 7, wherein the first conductive layer of the conductive sheet has an outer shape in plan view smaller than an outer shape of each of the first insulating layer and the second insulating layer across an outer periphery, wherein the first insulating layer and the second insulating layer each includes a peripheral edge portion extending outward from the first conductive layer, wherein the peripheral edge portion of the first insulating layer and the peripheral edge portion of the second insulating layer are joined to each other, wherein the second conductive layer of the conductive sheet has an outer shape in plan view smaller than an outer shape of each of the third insulating layer and the fourth insulating layer across an outer periphery, wherein the third insulating layer and the fourth insulating layer each includes a peripheral edge portion extending outward from the second conductive layer, and wherein the peripheral edge portion of the third insulating layer and the peripheral edge portion of the fourth insulating layer are joined to each other.

(Supplementary Note 10)

An electronic device, comprising the fitting structure for a conductive sheet of any one of supplementary notes 1 to 9, the first case piece, the second case piece, and the ground pattern.

(Supplementary Note 11)

A fitting structure for a conductive sheet according to any one of supplementary notes 2 and 4 to 8, wherein the first insulating layer is bonded to the first conductive layer through use of an adhesive, and wherein the second insulating layer is formed of a double-sided pressure-sensitive adhesive tape including an insulating base sheet, and a first pressure-sensitive adhesive layer and a second pressure-sensitive adhesive layer respectively formed on both sheet surfaces of the insulating base sheet, the first pressure-sensitive adhesive layer of the double-sided pressure-sensitive adhesive tape being bonded to the first conductive layer, the second pressure-sensitive adhesive layer of the double-sided pressure-sensitive adhesive tape being bonded to an inner side surface of the second case piece of the electronic device.

(Supplementary Note 12)

A fitting structure for a conductive sheet according to any one of supplementary notes 3 to 7 and 9, wherein the first insulating layer is bonded to the first conductive layer through use of an adhesive, wherein the second insulating layer is formed of a first double-sided pressure-sensitive adhesive tape including an insulating base sheet, and a first pressure-sensitive adhesive layer and a second pressure-sensitive adhesive layer formed respectively on both sheet surfaces of the insulating base sheet, the first pressure-sensitive adhesive layer of the first double-sided pressure-sensitive adhesive tape being bonded to the first conductive layer, the second pressure-sensitive adhesive layer of the first double-sided pressure-sensitive adhesive tape being bonded to the third insulating layer, wherein the third insulating layer is bonded to the second conductive layer through use of an adhesive, and wherein the fourth insulating layer is formed of a second double-sided pressure-sensitive adhesive tape including an insulating base sheet, and a first pressure-sensitive adhesive layer and a second pressure-sensitive adhesive layer formed respectively on both sheet surfaces of the insulating base sheet, the first pressure-sensitive adhesive layer of the second double-sided pressure-sensitive adhesive tape being bonded to the second conductive layer, the second pressure-sensitive adhesive layer of the second double-sided pressure-sensitive adhesive tape being bonded to an inner side surface of the second case piece of the electronic device.

(Supplementary Note 13)

A fitting structure for a conductive sheet according to any one of supplementary notes 2 and 4 to 8, wherein the first insulating layer is formed of a pressure-sensitive adhesive film including an insulating film and a pressure-sensitive adhesive layer formed on one film surface of the insulating film, the pressure-sensitive adhesive layer of the pressure-sensitive adhesive film being bonded to the conductive layer, and wherein the second insulating layer is formed of a double-sided pressure-sensitive adhesive tape including an insulating base sheet, and a first pressure-sensitive adhesive layer and a second pressure-sensitive adhesive layer formed respectively on both sheet surfaces of the insulating base sheet, the first pressure-sensitive adhesive layer of the double-sided pressure-sensitive adhesive tape being bonded to the conductive layer, the second pressure-sensitive adhesive layer of the double-sided pressure-sensitive adhesive tape being bonded to an inner side surface of the second case piece of the electronic device.

(Supplementary Note 14)

A fitting structure for a conductive sheet according to any one of supplementary notes 3 to 7 and 9, wherein the first insulating layer is formed of a first pressure-sensitive adhesive film including an insulating film and a pressure-sensitive adhesive layer formed on one film surface of the insulating film, the pressure-sensitive adhesive layer of the first pressure-sensitive adhesive film being bonded to the first conductive layer, wherein the second insulating layer is formed of a first double-sided pressure-sensitive adhesive tape including an insulating base sheet, and a first pressure-sensitive adhesive layer and a second pressure-sensitive adhesive layer formed respectively on both sheet surfaces of the insulating base sheet, the first pressure-sensitive adhesive layer of the first double-sided pressure-sensitive adhesive tape being bonded to the first conductive layer, the second pressure-sensitive adhesive layer of the first double-sided pressure-sensitive adhesive tape being bonded to the third insulating layer, wherein the third insulating layer is formed of a second pressure-sensitive adhesive film including an insulating film and a pressure-sensitive adhesive layer formed on one film surface of the insulating film, the pressure-sensitive adhesive layer of the second pressure-sensitive adhesive film being bonded to the second conductive layer, and wherein the fourth insulating layer is formed of a second double-sided pressure-sensitive adhesive tape including an insulating base sheet, and a first pressure-sensitive adhesive layer and a second pressure-sensitive adhesive layer formed respectively on both sheet surfaces of the insulating base sheet, the first pressure-sensitive adhesive layer of the second double-sided pressure-sensitive adhesive tape being bonded to the second conductive layer, the second pressure-sensitive adhesive layer of the second double-sided pressure-sensitive adhesive tape being bonded to an inner side surface of the second case piece of the electronic device.

(Supplementary Note 15)

An electronic device, comprising:

a first member having at least a ground pattern;

a second member including a conductive sheet including at least a conductive layer; and a conductive member interposed between the first member and the second member, wherein, under a state in which the first member and the second member are coupled so as to be opposed to each other, one end of the conductive member is electrically connected to the ground pattern, and another end of the conductive member is electrically connected to the conductive layer, to thereby bring the ground pattern and the conductive layer into electrical conduction.

REFERENCE SIGNS LIST

10 conductive member
20, 30 conductive sheet
21 conductive layer
22, 32 first insulating layer
222, 322 cutout portion
23, 33 second insulating layer
31 first conductive layer
36 second conductive layer
37 third insulating layer
38 fourth insulating layer
60 case
61 front case (first case piece)
62 rear case (second case piece)
62*p*1, 62*p*2, 62*p*3, 62*p*4 protrusion
62*w*1, 62*w*2 peripheral edge wall portion
63 battery accommodating portion lid
64 SSD accommodating portion lid
66 case frame
71 substrate assembly
71*g* ground pattern
71*l* land pattern
71*v* through hole
712 crystal oscillator
display with touch panel
FG frame ground
SG signal ground

The invention claimed is:

1. A fitting structure for a conductive sheet, comprising:
a conductive member, which is arranged in a predetermined region of a first case piece of an electronic device that includes the first case piece and a second case piece, the first case piece and the second case piece being separably coupled to each other, and is electrically connected to a ground pattern of the electronic device; and
a conductive sheet, which includes a conductive layer, and is arranged in the second case piece so as to be opposed to the predetermined region of the first case piece,
wherein, under a state in which the first case piece and the second case piece are coupled to each other, the conductive layer of the conductive sheet is brought into contact with the conductive member and is electrically connected to the ground pattern of the electronic device,
wherein the predetermined region is:
a partial region on a substrate assembly arranged in the first case piece; and
a region in which an operation of the electronic device is possibly influenced by an extrinsic noise, or a region in which an unnecessary electromagnetic wave from the electronic device itself is required to be reduced or suppressed,
wherein the conductive sheet is bonded to a region that is opposed to the predetermined region in an inner side surface of the second case piece,
wherein the conductive sheet includes at least a first insulating layer, a first conductive layer as the conductive layer, and a second insulating layer that are laminated on one another,
wherein the first insulating layer includes a cutout portion for exposing a part of a surface of the conductive layer,
wherein, under a state in which the first case piece and the second case piece are coupled to each other, the conductive layer is brought into contact with the conductive member through the cutout portion of the first insulating layer of the conductive sheet and is electrically connected to the ground pattern of the electronic device.

2. A fitting structure for a conductive sheet according to claim 1,
wherein the conductive member is made of a metal, is soldered to a land pattern that is formed on the substrate assembly in the predetermined region and has the same potential as a potential of the ground pattern of the electronic device, has a shape in which a cantilever beam extending obliquely has a contact portion at a distal end, and has elasticity in a direction in which the first case piece and the second case piece of the electronic devices are coupled to each other.

3. A fitting structure for a conductive sheet according to claim 1,
wherein the conductive sheet further includes a third insulating layer, a second conductive layer, and a fourth insulating layer that are laminated on one another, and
wherein the second conductive layer is not electrically connected to the ground pattern of the electronic device.

4. A fitting structure for a conductive sheet according to claim 1, wherein the conductive sheet is positioned through use of a protruding portion in the second case piece of the electronic device.

5. A fitting structure for a conductive sheet according to claim 1, wherein the conductive sheet has flexibility.

6. A fitting structure for a conductive sheet according to claim 1,
wherein the conductive layer of the conductive sheet has an outer shape in plan view smaller than an outer shape of each of the first insulating layer and the second insulating layer across an outer periphery,
wherein the first insulating layer and the second insulating layer each includes a peripheral edge portion extending outward from the conductive layer, and
wherein the peripheral edge portion of the first insulating layer and the peripheral edge portion of the second insulating layer are joined to each other.

7. A fitting structure for a conductive sheet according to claim 3,
wherein the first conductive layer of the conductive sheet has an outer shape in plan view smaller than an outer shape of each of the first insulating layer and the second insulating layer across an outer periphery,
wherein the first insulating layer and the second insulating layer each includes a peripheral edge portion extending outward from the first conductive layer,
wherein the peripheral edge portion of the first insulating layer and the peripheral edge portion of the second insulating layer are joined to each other,
wherein the second conductive layer of the conductive sheet has an outer shape in plan view smaller than an outer shape of each of the third insulating layer and the fourth insulating layer across an outer periphery, wherein the third insulating layer and the fourth insulating layer each includes a peripheral edge portion extending outward from the second conductive layer, and wherein the peripheral edge portion of the third insulating layer and the peripheral edge portion of the fourth insulating layer are joined to each other.

8. An electronic device, comprising the fitting structure for a conductive sheet of claim 1, the first case piece, the second case piece, and the ground pattern.

9. A fitting structure for a conductive sheet according to claim 2, wherein the conductive sheet further includes a third insulating layer, a second conductive layer, and a fourth insulating layer that are laminated on one another, and wherein the second conductive layer is not electrically connected to the ground pattern of the electronic device.

10. A fitting structure for a conductive sheet according to claim 2, wherein the conductive sheet is positioned through use of a protruding portion in the second case piece of the electronic device.

11. A fitting structure for a conductive sheet according to claim 3, wherein the conductive sheet is positioned through use of a protruding portion in the second case piece of the electronic device.

12. A fitting structure for a conductive sheet according to claim 2, wherein the conductive sheet has flexibility.

13. A fitting structure for a conductive sheet according to claim 3, wherein the conductive sheet has flexibility.

14. A fitting structure for a conductive sheet according to claim 4, wherein the conductive sheet has flexibility.

15. A fitting structure for a conductive sheet according to claim 2, wherein the conductive layer of the conductive sheet has an outer shape in plan view smaller than an outer shape of each of the first insulating layer and the second insulating layer across an outer periphery, wherein the first insulating layer and the second insulating layer each includes a peripheral edge portion extending outward from the conductive layer, and wherein the peripheral edge portion of the first insulating layer and the peripheral edge portion of the second insulating layer are joined to each other.

16. A fitting structure for a conductive sheet according to claim 3, wherein the conductive layer of the conductive sheet has an outer shape in plan view smaller than an outer shape of each of the first insulating layer and the second insulating layer across an outer periphery, wherein the first insulating layer and the second insulating layer each includes a peripheral edge portion extending outward from the conductive layer, and wherein the peripheral edge portion of the first insulating layer and the peripheral edge portion of the second insulating layer are joined to each other.

17. A fitting structure for a conductive sheet according to claim 4, wherein the conductive layer of the conductive sheet has an outer shape in plan view smaller than an outer shape of each of the first insulating layer and the second insulating layer across an outer periphery, wherein the first insulating layer and the second insulating layer each includes a peripheral edge portion extending outward from the conductive layer, and wherein the peripheral edge portion of the first insulating layer and the peripheral edge portion of the second insulating layer are joined to each other.

18. A fitting structure for a conductive sheet according to claim 5, wherein the conductive layer of the conductive sheet has an outer shape in plan view smaller than an outer shape of each of the first insulating layer and the second insulating layer across an outer periphery, wherein the first insulating layer and the second insulating layer each includes a peripheral edge portion extending outward from the conductive layer, and wherein the peripheral edge portion of the first insulating layer and the peripheral edge portion of the second insulating layer are joined to each other.

* * * * *